(12) United States Patent
Craven et al.

(10) Patent No.: US 7,091,514 B2
(45) Date of Patent: Aug. 15, 2006

(54) NON-POLAR (AL,B,IN,GA)N QUANTUM WELL AND HETEROSTRUCTURE MATERIALS AND DEVICES

(75) Inventors: Michael D. Craven, Goleta, CA (US); Stacia Keller, Goleta, CA (US); Steven P. Denbaars, Goleta, CA (US); Tal Margalith, Santa Barbara, CA (US); James Stephen Speck, Goleta, CA (US); Shuji Nakamura, Santa Barbara, CA (US); Umesh K. Mishra, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 25 days.

(21) Appl. No.: 10/413,690

(22) Filed: Apr. 15, 2003

(65) Prior Publication Data
US 2005/0040385 A1 Feb. 24, 2005

Related U.S. Application Data

(60) Provisional application No. 60/372,909, filed on Apr. 15, 2002.

(51) Int. Cl.
*H01L 31/072* (2006.01)
(52) U.S. Cl. ............................................. 257/14; 257/11
(58) Field of Classification Search ................ 257/14, 257/11, 12, 19, 347
See application file for complete search history.

(56) References Cited

U.S. PATENT DOCUMENTS

| | | | |
|---|---|---|---|
| 6,153,010 A | * | 11/2000 | Kiyoku et al. ............. 117/95 |
| 6,156,581 A | * | 12/2000 | Vaudo et al. ............... 438/22 |
| 6,177,292 B1 | | 1/2001 | Hong et al. |
| 6,180,270 B1 | | 1/2001 | Cole et al. |
| 6,350,666 B1 | | 2/2002 | Kryliouk |
| 6,413,627 B1 | | 7/2002 | Motoki et al. |
| 6,441,391 B1 | | 8/2002 | Ohno et al. |
| 6,582,986 B1 | | 6/2003 | Kong et al. |
| 6,586,316 B1 | | 7/2003 | Tsuda et al. |
| 6,602,763 B1 | | 8/2003 | Davis et al. |
| 6,635,901 B1 | | 10/2003 | Sawaki et al. |
| 6,645,295 B1 | | 11/2003 | Koike et al. |
| 2001/0029086 A1 | | 10/2001 | Ogawa et al. |
| 2002/0098641 A1 | | 7/2002 | Tsuda et al. |

(Continued)

FOREIGN PATENT DOCUMENTS

EP 0 942 459 4/1998

(Continued)

OTHER PUBLICATIONS

Iwata, K., et al., "Gas Source Molecular Beam Epitaxy Growth of GaN on C-, A-, R-, and M-Plane Sapphire and Silica Glass Substrates" Ipn. J. Appl. Phys. vol. 36 (1997), pp. L 661-L664.

(Continued)

*Primary Examiner*—David Nelms
*Assistant Examiner*—Thinh T Nguyen
(74) *Attorney, Agent, or Firm*—Gates & Cooper LLP

(57) ABSTRACT

A method for forming non-polar (Al,B,In,Ga)N quantum well and heterostructure materials and devices. Non-polar ($11\bar{2}0$) a-plane GaN layers are grown on an r-plane ($1\bar{1}02$) sapphire substrate using MOCVD. These non-polar ($11\bar{2}0$) a-plane GaN layers comprise templates for producing non-polar (Al,B,In,Ga)N quantum well and heterostructure materials and devices.

9 Claims, 4 Drawing Sheets

U.S. PATENT DOCUMENTS

2004/0108513 A1     6/2004     Narukawa et al.

FOREIGN PATENT DOCUMENTS

| | | |
|---|---|---|
| JP | 2001 257166 | 9/2001 |
| JP | 2002 076329 | 3/2002 |
| JP | 2002 076521 | 3/2002 |

OTHER PUBLICATIONS

Kapolnck, D., et al., "Anisotropic epitaxial lateral growth in GaN selective area epitaxy" Appl. Phys. Lett. 71 (9), Sep. 1, 1997, pp. 1204-1206.

Langer, R., et al., "Giant electric fields in unstrained GaN single quantum wells" Appl. Phys. Lett., 74 (25), Jun. 21, 1999, pp. 3827-3829.

Lefebvre, P. et al., "High internal electric field in a graded-width InGaN/GaN quantum well: Accurate determination by time-resolved photoluminescence spectroscopy" Appl. Phys. Lett. 78 (9), Feb. 26, 2001, pp. 1252-1254.

Lefebvre, P., et al., "Time-resolved photoluminescence as a probe of internal electric fields in GaN—(GaAl)N quantum wells" Phys. Rev. B. 59 (23), Jun. 15, 1999-I, pp. 15363-15367.

Lei, T., "Heteroepitaxy, polymorphism, and faulting in GaN thin films on silicon and sapphire substrates" J. Appl. Phys. 74 (7), Oct. 1, 1993, pp. 4430-4437.

Leroux, M., "Barrier-width dependence of group-III nitrides quantum-well transition energies" Phys. Rev. B. 60 (3), Jul. 15, 1991-I, pp. 1496-1499.

Leszcynski, M., et al., "Lattice parameters of gallium nitride" Appl. Phys. Lett. 69 (1), Jul. 1, 1996, pp. 73-75.

Liu, L. et al., "Substrates for gallium nitride epitaxy", Materials Science and Engineering R, Reports: A Review Journal, vol. 37, No. 3, Apr. 30, 2002, pp. 61-127.

Marchand, H., et al., "Microstructure of GaN laterally overgrown by metalorganic chemical vapor deposition" Appl. Phys. Lett. 73 (6), Aug. 10, 1998, pp. 747-749.

Marchand, H., et al., "Atomic force microscopy observation of threading dislocation density reduction in lateral epitaxial overgrowth of gallium nitride by MOCVD" MRS Internet J. Nitride Semicond. Res. 3, 3 (1998), pp. 1-7.

Marchand, H., et al., "Mechanisms of lateral epitaxial overgrowth of gallium nitride by metalorganic chemical vapor deposition" J. of Crystal Growth, vol. 195, No. 1-4, Dec. 15, 1998, pp. 328-332.

Metzger, Th., et al., "X-Ray Diffraction Study of Gallium Nitride Grown by MOCVD" Physica status solidi (b) 193, 1996, pp. 391-7.

B. Monemar, et al., "Properties of Zn-doped VPE-grown GaN.I.Luminescence data in relation to doping conditions" J. Appl. Phys. 51 (1), Jan. 1980, pp. 625-639.

Moustakas, T.D., et al., "Growth of GaN by ECR-assisted MBE" Physica B 185, 1993, pp. 36-49.

Motoki, J., et al., "Preparation of Large Freestanding GaN Substrates by Hydride Vapor Phase Epitaxy Using GaAs as a Starting Substrate" Jpn. J. Appl. Phys. vol. 40 (2), (2001), pp. L140-L143.

Nakamura, S, et al., "Violet InGaN/GaN/AlGaN-Based Laser Diodes Operable at 50° C. with a Fundamental Transverse Mode" Jpn. J. Appl. Phys. 38 (2), 1999, pp. L226-L229.

Nam, O., et al., "Lateral epitaxy of low defect density GaN layers via organometallic vapor phase epitaxy" Appl. Phys. Lett. 71 (18), Nov. 3, 1997, pp. 2638-2640.

Nataf, G., et al., "Lateral overgrowth of high quality GaN layers on GaN/Al$_2$O$_3$ patterned substrates by halide vapour-phase epitaxy" J. of Crystal Growth (192), Feb. 20, 1998, pp. 73-78.

Ng, H. M., "Molecular-beam epitaxy of GaN/Al$_x$Ga$_{1-x}$N multiple quantum wells on R-plane (1012) sapphire substrates" Appl. Phys. Lett. 80 (23), Jun. 10, 2002, pp. 4369-4371.

Nishida, T., et al., "Ten Milliwatt Operation of an AlGaN-Based Light Emitting Diode Grown on GaN Substrate" Phys. Stat. Sol. (a) 188 (1), 2001, pp. 113-116.

Park, S., et al., "Spontaneous polarization effects in wurtzite GaN/AlGaN quantum wells and comparison with experiment" Appl. Phys. Lett. 76 (15) Apr. 10, 2000, pp. 1981-1983.

Park, J., et al., "Selective-area and lateral epitaxial overgrowth of III-N materials by metal organic chemical vapor deposition" Appl. Phys. Lett. 73 (3), Jul. 20, 1998, pp. 333-335.

Parilliaud, O., et al., "Localized Epitaxy of GaN by HVPE on patterned Substrates" MRS Internet J. Nitride Semicond. Res. 3 (40), Oct. 19, 1998, pp. 1-9.

Paskova, T., et al., "Defect Reduction in HVPE Growth of GaN and Related Optical Spectra" Phys. Stat. Sol. (a) 183, (2001), pp. 197-203.

Rosner, S.J., et. al., "Cathodoluminescence mapping of epitaxial lateral overgrowth in gallium nitride" Appl. Phys. Lett. 74 (14), Apr. 5, 1999, pp. 2035-2037.

Sakai, A., et al., "Self-organized propagation of dislocations in GaN films during epitaxial lateral growth" Appl. Phys. Lett. 76 (4), Jan. 24, 2000, pp. 442-444.

Sano, M., et al., "Epitaxial Growth of Undoped and Mg-Doped GaN" Jpn. J. of Appl. Phys. 15 (10), Oct. 1976, pp. 1943-1950.

Shintani, A., et al. "Light Emitting Patterns of Gallium Nitride Electroluminescence" J. Electrochem. Soc. 123 (10), Oct. 1976, pp. 1575-1578.

Smorchkova, I.P., et. al., "Polarization-induced charge and electron mobility in AlGaN/GaN heterostructures grown by plasma-assisted molecular-beam epitaxy" J. Appl. Phys. 86 (8), Oct. 15, 1999, pp. 4520-4526.

Takeuchi, T., et. al., "Determination of piezoelectric fields in strained GaLnN quantum wells using the quantum-confined Stark effect" Appl. Phys. Lett. 73 (12), Sep. 21, 1998, pp. 1691-1693.

Takeuchi, T., et. al., "Quantum-Confined Stark Effect due to Piezoelectric Fields in GaInN Strained Quantum Wells" Jpn. J. Appl. Phys. vol. 36, Apr. 1, 1997, pp. L382-385.

Tan, I-H., et. al., "A self consistent solution of Schrodinger-Poisson equations using a nonuniform mesh" J. Appl. Phys. 68 (8), Oct. 15, 1990, pp. 4071-4076.

Tsuchiya, H., et al., "Growth condition dependence of GaN crystal structure on (0 0 1)GaAs by hydride vapor-phase epitaxy" J. of Crystal Growth (189/190), 1998, pp. 395-400.

Waltereit, P., et. al., "Nitride semiconductors free of electrostatic fields for efficient white light-emitting diodes" Nature vol. 406, Aug. 24, 2000, pp. 865-868.

Wright, A.F., "Elastic properties of zinc-blende and wurtzite AlN, GaN, and InN" J. Appl. Phys. 82 (6), Sep. 15, 1997, pp. 2833-2839.

Yablonovitch, E., et. al., "Reduction of Lashing Threshold Current Density by the Lowering of Valence Band Effective Mass" J. of Lightwave Tech. vol. LT-4 (5), May 1986, pp. 504-506.

Zheleva, T., et. al., "Dislocation density reduction via lateral epitaxy in selectivity grown GaN structures" Appl. Phys. Lett. 71 (17), Oct. 27, 1997, pp. 2472-2474.

Zheleva, T., et. al., "Pendo-epitaxy—A new approach for lateral growth of gallium nitride structures" MRS Internet J. Nitride Semicond. Res. 4S1, G3.38 (1999).

Yu., Z., et. al., "Epitaxial lateral ovregrowth of GaN on SiC and sapphire substrates" MRS Internet J. Nitride Semicond. Res. 4S1, G4.3 (1999).

Amano, H., et. al., "Metalorganic vapor phase epitaxial growth of a high quality GaN film using an AlN buffer layer" Appl. Phys. Lett. 48 (5), Feb. 3, 1986, pp. 353-355.

Ambacher, O., et. al., "Two-dimensional electron gases induced by spontaneous and piezoelectric polarization charges in N- and Ga-face AlGaN/GaN heterostructures" J. Appl. Phys., 85 (6), Mar. 15, 1999, pp. 3222-3233.

Bottcher, T., et al., "The role of high-temperature island coalescence in the development of stresses in GaN films" Appl. Phys. Lett. 78 (14), Apr. 2, 2001, pp. 1976-1978.

Brandt, O., et al., "Determination of strain state and composition of highly mismatched group-III nitride heterostructures by x-ray diffraction" J. Phys. D. Appl. Phys. 35 (2002), pp. 577-585.

Craven M.D., et al., "Characterization of a-Plane GaN/(Al,Ga)N Multiple Quantum Wells Grown via Metalorganic Chemical Vapor Deposition" Jpn. J. Appl. Phys. vol. 42, (2003), pp. L235-L238.

Craven, M.D., et al., "Threading dislocation reduction via laterally overgrown nonpolar (1120) a-plane GaN" Appl. Phys. Lett. 81 (7), Aug. 12, 2002, pp. 1201-1203.

Dovidenko, K., et. al., Characteristics of stacking faults in AlN thin films J. Appl. Phys. 82 (9), Nov. 1, 1997, pp. 4296-4299.

Dupuis, R.D., et al., "Selective-area and lateral epitaxial overgrowth of III-N materials by metalorganic chemical vapor depostion" J. Crystal Growh, vol. 195, No. 1-4, Dec. 15, 1998, pp. 340-345.

Eastman, L.F., "The Toughest Transistor Yet" IEEE Spectrum 39 (5), May 2002, pp. 28-33.

Eddy, C.R., Jr., "Growth of gallium nitride thins films by electron cyclotron resonance microwave plasma-assisted molecular beam epitaxy" J. Appl. Phys. 73 (1), Jan. 1, 1993, pp. 448-455.

Etzkom, E.V., et al., "Cracking of GaN films" J. Appl. Phys. 89 (2), Jan. 15, 2001, pp. 1025-1034.

Freitas, J. A., Jr., et al., "Optical characterization of lateral epitaxial overgrown GaN layers" Appl. Phys. Lett. 72 (23), Jun. 8, 1998, pp. 2990-2992.

Grandjean, N., et al., "Built-in electric-field effects in wurtzite AlGaN quantum wells" J. Appl. Phys. 86 (7), Oct. 1, 1999, pp. 3714-3720.

Heying, B., et al., "Role of threading dislocation structure on the x-ray diffraction peak widths in epitaxial GaN films" Appl. Phys. Lett. 68 (5), Jan. 29, 1996, pp. 643-645.

Im, J.S., et. al., "Reduction of oscillator strength due to piezoelectric fields in $GaN/Al_xGa_{1-x}N$ quantum wells" Phys. Rev. B. 57 (16), Apr. 15, 1998-II, pp. R9435-R9438.

Wang, F. et al., "Crystal Tilting in the Epitaxial Laterally Overgrown GaN Films on Sapphire Substrate by Hydride Vapor Phase Epitaxy", Solid State and Integrated-Circuit Technology Proceedings, 6th International Conference, Oct. 2001, vol. 2, pp. 1998-1201.

Maruska, H.P. et al., "Development of 50 mm Diameter Non-Polar Gallium Nitride Substrates for Device Applications", International Conference on Indium Phosphide and Related Materials, May 16, 2003, pp. 567-570.

M.D. Craven et al., "Structural characterization of nonplar (1120) a-plane GaN thin films grown on (1102) r-plane sapphire," Jul. 2002, Applied Physics Letters, 81(3):469-471.

T. Sasaki et al., "Substrate-orientation dependence of GaN single-crystal films grown by metalorganic vapor-phase epitaxy," 1987, J. Appl. Phys. 61(7):2533-2540.

Craven, M.D. et al., "Structural characterization of nonpolar (1120) a-plane GaN thin films grown on (1102) r-plane sapphire", Applied Physics Letters, vol. 81, No. 3, Jul. 15, 2002, pp. 469-471, XP002250684.

Grzegory, I. et al., "Seeded growth of GaN at high $N_2$ pressure on (0 0 0 1) polar surfaces of GaN single crystalline substrates", Materials Science in Semiconductor Processing, vol. 4, No. 6, Dec. 2001, pp. 535-541, XP004345737.

Mills, Alan, "Wide-bandgap emitters continue to improve", III-Vs Review, vol. 13, No. 3, May 2000, pp. 23-24, 26, 28-30, XP004200697.

Sasaki, T. et al, "Substrate-orientation dependence of GaN single-crystal films grown by metalorganic vapor-phase epitaxy", Journal of Applied Physics, American Institute of Physics, vol. 61, No. 7, Apr. 1, 1987, pp. 2533-2540, XP000820119.

Sun, Chien-Jen et al., "Comparison of the physical properties of GaN thin films deposited on (0001) and (0112) sapphire substrates", Applied Physics Letters, vol. 63, No. 7, 1993, pp. 973-975, XP002251480.

Amano, H. et al., "Stress and Defect Control in GaN Using Low Temperature Interlayers," Jpn. J. Appl. Phys. vol. 37 (1998), pp. L 1540-L 1542.

* cited by examiner

NON-POLAR (AL,B,IN,GA)N QUANTUM WELL AND HETEROSTRUCTURE MATERIALS AND DEVICES

CROSS-REFERENCE TO RELATED APPLICATIONS

This application claims the benefit under 35 U.S.C. §119(e) of the following co-pending and commonly-assigned U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. DenBaars, Tal Margalith, James S. Speck, Shuji Nakamura, and Umesh K. Mishra, which application is incorporated by reference herein.

This application is related to the following co-pending and commonly-assigned United States Utility Patent Applications:

Ser. No. 10/413,691, entitled "NON-POLAR A-PLANE GALLIUM NITRIDE THIN FILMS GROWN BY METALORGANIC CHEMICAL VAPOR DEPOSITION," filed on Apr. 15, 2003, by Michael D. Craven and James S. Speck; and Ser. No. 10/413,913, entitled "DISLOCATION REDUCTION IN NON-POLAR GALLIUM NITRIDE THIN FILMS," filed on Apr. 15, 2003, by Michael D. Craven, Stacia Keller, Steven P. DenBaars, Tal Margalith, James S. Speck, Shuji Nakamura, and Umesh K. Mishra, now U.S. Pat. No. 6,900,070, issued May 31, 2005;

both of which applications are incorporated by reference herein.

STATEMENT OF GOVERNMENT SUPPORT

This invention was made with Government support by the Office of Naval Research Grant N00014-97-C-0192. The government may have certain rights in this invention.

1. FIELD OF THE INVENTION

The invention is related to semiconductor materials, methods, and devices, and more particularly, to non-polar (Al,B,In,Ga)N quantum well and heterostructure materials and devices.

2. DESCRIPTION OF THE RELATED ART (Note: This application references a number of different patents, applications and/or publications as indicated throughout the specification by one or more reference numbers. A list of these different publications ordered according to these reference numbers can be found below in the section entitled "References." Each of these publications is incorporated by reference herein.)

Current state of the art (Al,B,In,Ga)N heterostructures and quantum well structures employ c-plane (0001) layers. The total polarization of a III-N film consists of spontaneous and piezoelectric polarization contributions, which both originate from the single polar [0001] axis of the wurtzite nitride crystal structure. Polarization discontinuities which exist at surfaces and interfaces within nitride heterostructures are associated with fixed sheet charges, which in turn produce electric fields. Since the alignment of these internal electric fields coincides with the growth direction of the c-plane (0001) layers, the fields affect the energy bands of device structures.

In quantum wells, the "tilted" energy bands spatially separate electrons and hole wave functions, which reduces the oscillator strength of radiative transitions and red-shifts the emission wavelength. These effects are manifestations of the quantum confined Stark effect (QCSE) and have been thoroughly analyzed for GaN/(Al,Ga)N quantum wells. See References 1–8. Additionally, the large polarization-induced fields are partially screened by dopants and impurities, so the emission characteristics can be difficult to engineer accurately.

The internal fields are also responsible for large mobile sheet charge densities in nitride-based transistor heterostructures. Although these large 2D electron gases (2DEGs) are attractive and useful for devices, the polarization-induced fields, and the 2DEG itself, are difficult to control accurately.

Non-polar growth is a promising means of circumventing the strong polarization-induced electric fields that exist in wurtzite nitride semiconductors. Polarization-induced electric fields do not affect wurtzite nitride semiconductors grown in non-polar directions (i.e., perpendicular to the [0001] axis) due to the absence of polarization discontinuities along non-polar growth directions.

Recently, two groups have grown non-polar GaN/(Al,Ga)N multiple quantum wells (MQWs) via molecular beam epitaxy (MBE) without the presence of polarization-induced electric fields along non-polar growth directions. Waltereit et al. grew m-plane GaN/Al$_{0.1}$Ga$_{0.9}$N MQWs on γ-LiAlO$_2$ (100) substrates and Ng grew a-plane GaN/Al$_{0.15}$Ga$_{0.85}$N MQW on r-plane sapphire substrates. See References 9–10.

Despite these results, the growth of non-polar GaN orientations remains difficult to achieve in a reproducible manner.

SUMMARY OF THE INVENTION

The present invention describes a method for forming non-polar (Al,B,In,Ga)N quantum well and heterostructure materials and devices. First, non-polar ($11\bar{2}0$) a-plane GaN thin films are grown on a ($1\bar{1}02$) r-plane sapphire substrate using metalorganic chemical vapor deposition (MOCVD). These non-polar ($11\bar{2}0$) a-plane GaN thin films are templates for producing non-polar (Al,B,In,Ga)N quantum well and heterostructure materials and devices thereon.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The purpose of the present invention is to provide a method for producing non-polar (Al,B,In,Ga)N quantum well and heterostructure materials and devices, using non-polar (11$\bar{2}$0) a-plane GaN thin films as templates.

The growth of device-quality non-polar (11$\bar{2}$0) a-plane GaN thin films on (1$\bar{1}$02) r-plane sapphire substrates via MOCVD is described in co-pending and commonly-assigned U.S. Provisional Patent Application Ser. No. 60/372,909, entitled "NON-POLAR GALLIUM NITRIDE BASED THIN FILMS AND HETEROSTRUCTURE MATERIALS," filed on Apr. 15, 2002, by Michael D. Craven, Stacia Keller, Steven P. DenBaars, Tal Margalith, James S. Speck, Shuji Nakamura, and Umesh K. Mishra, as well as co-pending and commonly-assigned U.S. Utility patent application Ser. No. 10/413,691, entitled "NON-POLAR A-PLANE GALLIUM NITRIDE THIN FILMS GROWN BY METALORGANIC CHEMICAL VAPOR DEPOSITION," filed on Apr. 15, 2003, by Michael D. Craven and James S. Speck, both of which applications are incorporated by reference herein.

The present invention focuses on the subsequent growth of (Al,B,In,Ga)N quantum wells and heterostructures on the (11$\bar{2}$0) a-plane GaN layers. The luminescence characteristics of these structures indicate that polarization-induced electric fields do not affect their electronic band structure, and consequently, polarization-free structures have been attained. The development of non-polar (Al,B,In,Ga)N quantum wells and heterostructures is important to the realization of high-performance (Al,B,In,Ga)N-based devices which are unaffected by polarization-induced electric fields.

Potential devices to be deposited on non-polar (11$\bar{2}$0) a-plane GaN layers include laser diodes (LDs), light emitting diodes (LEDs), resonant cavity LEDs (RC-LEDs), vertical cavity surface emitting lasers (VCSELs), high electron mobility transistors (HEMTs), heterojunction bipolar transistors (HBTs), heterojunction field effect transistors (HFETs), as well as UV and near-UV photodetectors.

Process Steps

Figure 1:
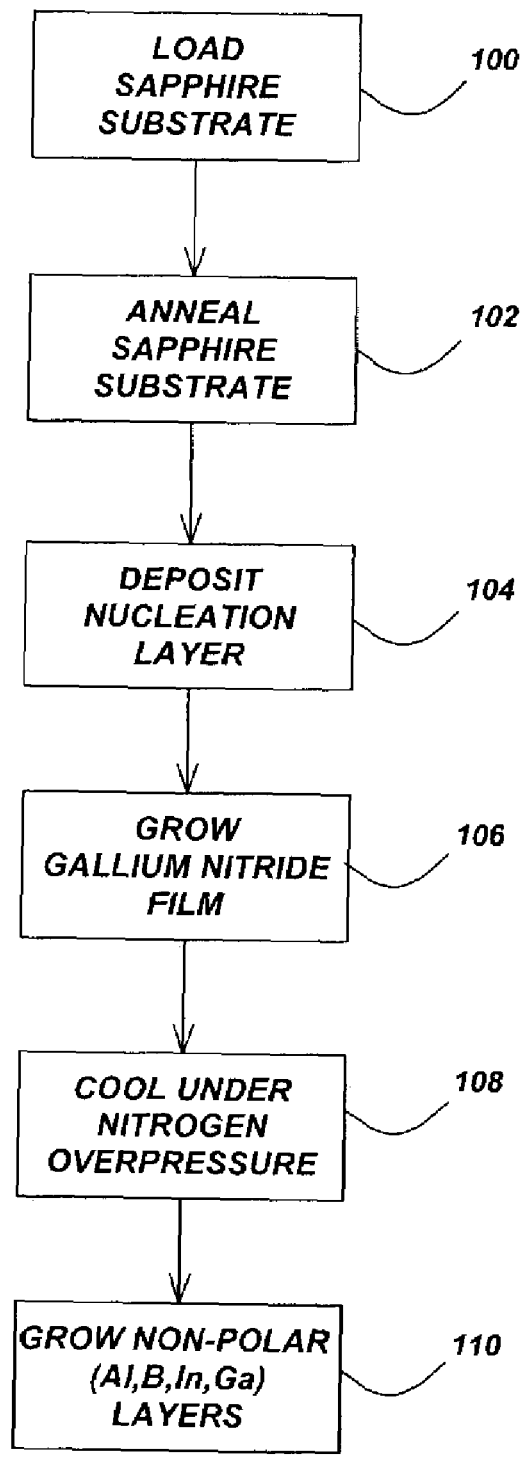
FIG. 1 is a flowchart that illustrates the steps of a method for forming non-polar (Al,B,In,Ga)N quantum well and heterostructure materials and devices according to a preferred embodiment of the present invention.

FIG. 1 is a flowchart that illustrates the steps of a method for forming non-polar (Al,B,In,Ga)N quantum well and heterostructure materials and devices according to a preferred embodiment of the present invention. The steps of this method include the growth of "template" (11$\bar{2}$0) a-plane GaN layers, followed by the growth of layers with differing alloy compositions for quantum wells and heterostructures.

Block 100 represents loading of a sapphire substrate into a vertical, close-spaced, rotating disk, MOCVD reactor. For this step, epi-ready sapphire substrates with surfaces crystallographically oriented within +/-2° of the sapphire r-plane (1$\bar{1}$02) may be obtained from commercial vendors. No ex-situ preparations need be performed prior to loading the sapphire substrate into the MOCVD reactor, although ex-situ cleaning of the sapphire substrate could be used as a precautionary measure.

Block 102 represents annealing the sapphire substrate in-situ at a high temperature (>1000° C.), which improves the quality of the substrate surface on the atomic scale. After annealing, the substrate temperature is reduced for the subsequent low temperature nucleation layer deposition.

Block 104 represents depositing a thin, low temperature, low pressure, nitride-based nucleation layer as a buffer layer on the sapphire substrate. Such layers are commonly used in the heteroepitaxial growth of c-plane (0001) nitride semiconductors. In the preferred embodiment, the nucleation layer is comprised of, but is not limited to, 1–100 nanometers (nm) of GaN deposited at approximately 400–900° C. and 1 atm.

After depositing the nucleation layer, the reactor temperature is raised to a high temperature, and Block 106 represents growing the epitaxial (11$\bar{2}$0) a-plane GaN layers to a thickness of approximately 1.5 µm. The high temperature growth conditions include, but are not limited to, approximately 1100° C. growth temperature, 0.2 atm or less growth pressure, 30 µmol per minute Ga flow, and 40,000 µmol per minute N flow, thereby providing a V/III ratio of approximately 1300). In the preferred embodiment, the precursors used as the group III and group V sources are trimethylgallium and ammonia, respectively, although alternative precursors could be used as well. In addition, growth conditions may be varied to produce different growth rates, e.g., between 5 and 9 Å per second, without departing from the scope of the present invention.

Upon completion of the high temperature growth step, Block 108 represents cooling the epitaxial (11$\bar{2}$0) a-plane GaN layers down under a nitrogen overpressure.

Finally, Block 110 represents non-polar (Al,B,In,Ga)N layers, with differing alloy compositions and hence differing electrical properties, being grown on the non-polar (11$\bar{2}$0) a-plane GaN layers. These non-polar (Al,B,In,Ga)N layers are used to produce quantum wells and heterostructures.

The quantum wells employ alternating layers of different bandgap such that "wells" are formed in the structure's energy band profile. The precise number of layers in the structure depends on the number of quantum wells desired. Upon excitation, electrons and holes accumulate in the wells of the conduction and valence bands, respectively. Band-to-band recombination occurs in the well layers since the density-of-states is highest at these locations. Thus, quantum wells can be engineered according to the desired emission characteristics and available epitaxial growth capabilities.

The nominal thickness and composition of the layers successfully grown on the non-polar (11$\bar{2}$0) a-plane GaN layers include, but are not limited to:

8 nm Si-doped In$_{0.03}$GaN barrier 1.5, 2.5, or 5 nm In$_{0.1}$GaN well

Moreover, the above Blocks may be repeated as necessary. In one example, Block 110 was repeated 5 times to form an MQW structure that was capped with GaN to maintain the integrity of the (In,Ga)N layers. In this example, the layers comprising the MQW structure were grown via MOCVD at a temperature of 825° C. and atmospheric pressure.

Figure 2:
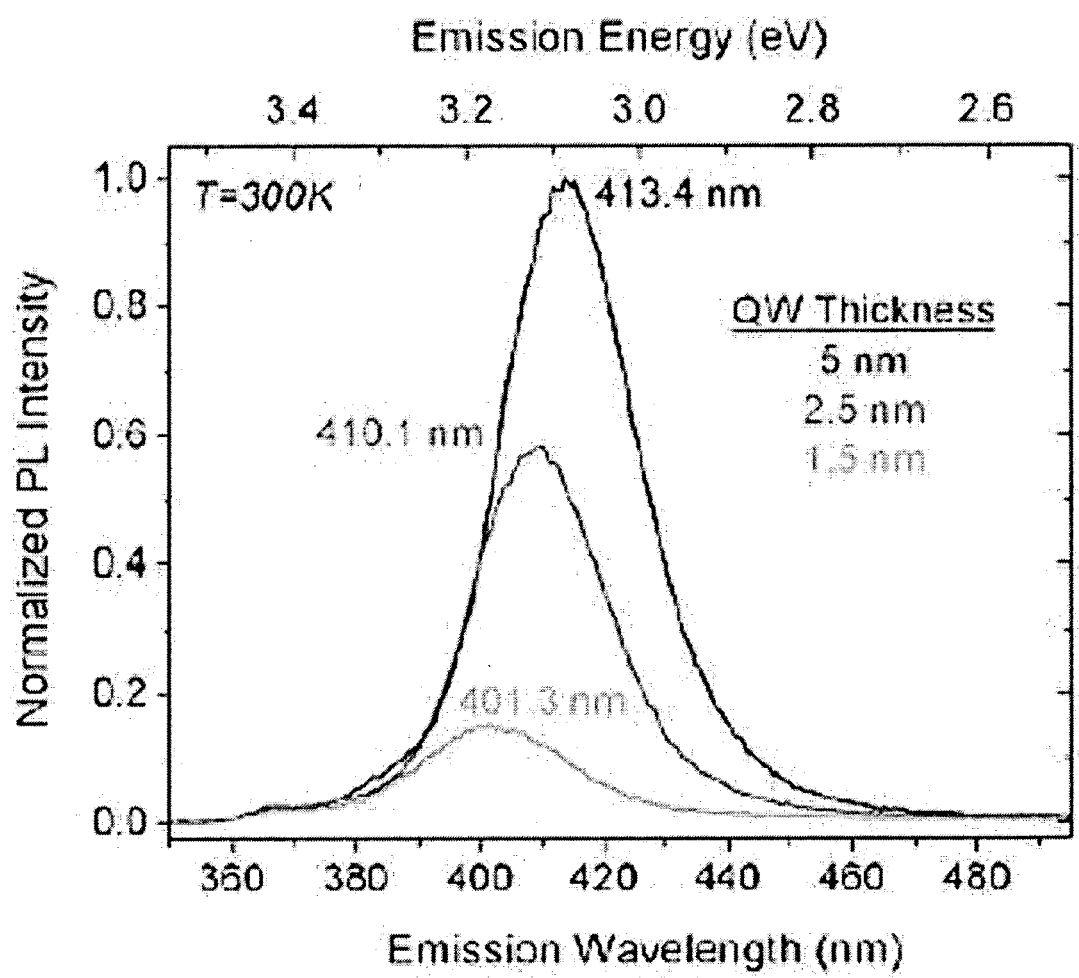
FIG. 2 illustrates the photoluminescence (PL) spectra of 5-period a-plane In$_{0.1}$GaN/In$_{0.03}$GaN MQW structures with nominal well widths of 1.5 nm, 2.5 nm, and 5.0 nm measured at room temperature.

The luminescence characteristics of this structure indicate that polarization-induced electric fields do not affect the band profiles, and the quantum wells can be considered polarization-free. For example, FIG. 2 illustrates the photoluminescence (PL) spectra of 5-period a-plane In$_{0.1}$GaN/In$_{0.03}$GaN MQW structures with nominal well widths of 1.5 nm, 2.5 nm, and 5.0 nm measured at room temperature. The peak PL emission wavelength and intensity increase with increasing well width.

Figure 3:
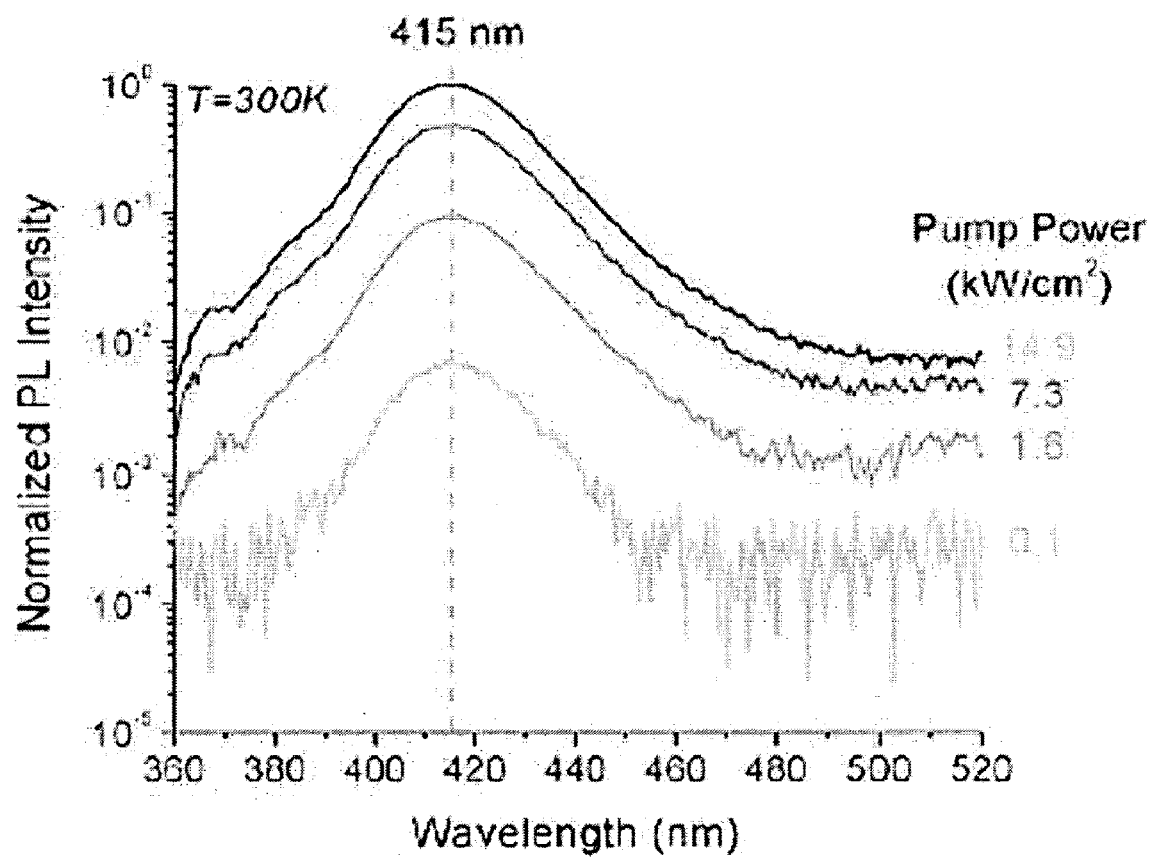
FIG. 3 illustrates the PL spectra of an a-plane In$_{0.03}$Ga$_{0.97}$N/In$_{0.1}$Ga$_{0.9}$N MQW structure with a nominal well width of 5.0 nm measured for various pump powers.

Further, FIG. 3 illustrates the PL spectra of an a-plane $In_{0.03}Ga_{0.97}N/In_{0.1}Ga_{0.9}N$ MQW structure with a nominal well width of 5.0 nm measured for various pump powers. PL intensity increases with pump power as expected while the peak emission wavelength is pump power independent, indicating that the band profiles are not influenced by polarization-induced electric fields.

In addition to (In,Ga)N quantum wells, heterostructures containing (Al,Ga)N/GaN superlattices may also be grown on the non-polar ($11\bar{2}0$) a-plane GaN layers. For example, heterostructures typically consist of two layers, most commonly (AlGa)N on GaN, to produce an electrical channel necessary for transistor operation. The thickness and composition of the superlattice layers may comprise, but are not limited to:

9 nm $Al_{0.4}GaN$ barrier 11 nm GaN well

In one example, Block 110 was repeated 10 times to form a 10-period $Al_{0.4}Ga_{0.6}N/GaN$ superlattice that was terminated with a 11 nm GaN well layer. The superlattice was grown via MOCVD at conditions similar to those employed for the underlying template layer: ~1100° C. growth temperature, ~0.1 atm growth pressure, 38 μmol/min Al flow, 20 μmol/min Ga flow, and 40,000 μmol/min N flow. The Al flow was simply turned off to form the GaN well layers. Successful growth conditions are not strictly defined by the values presented above. Similar to the (In,Ga)N quantum wells, the luminescence characteristics of the superlattice described above indicate that polarization fields do not affect the structure.

Figure 4:
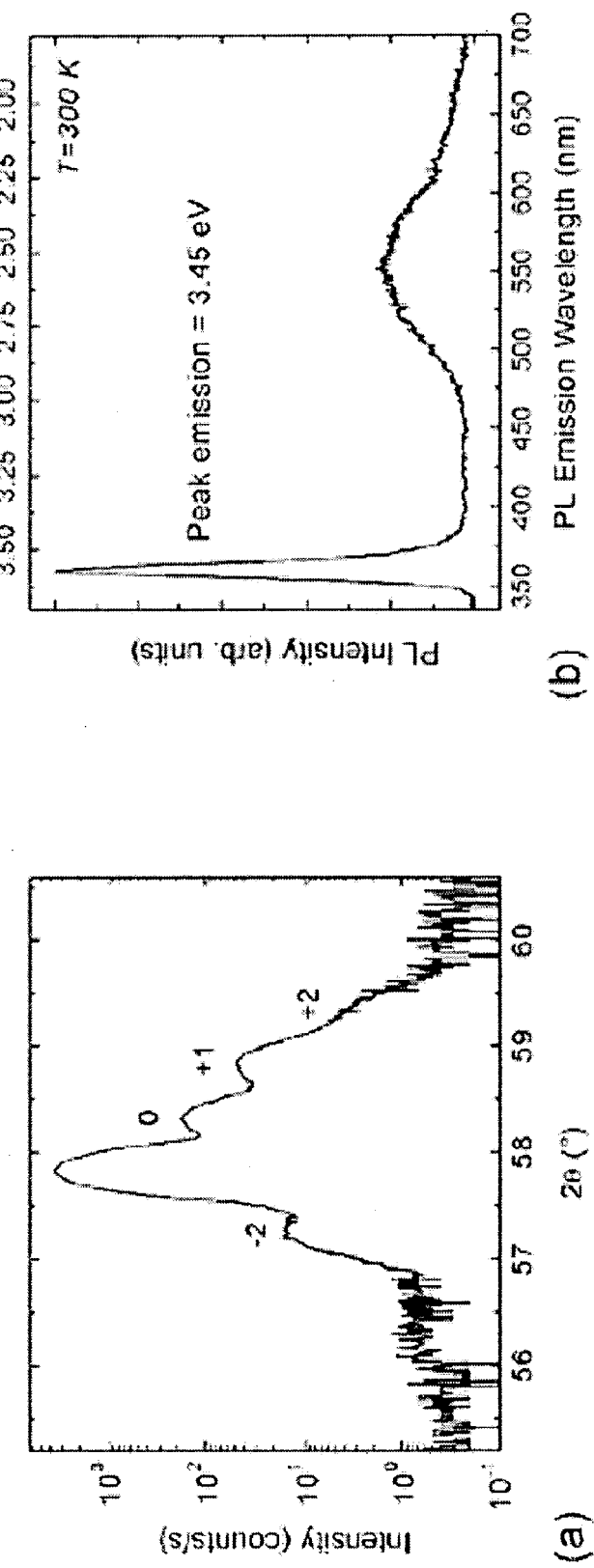
FIG. 4(a) shows a 2θ-ω x-ray diffraction scan of the 10-period Al$_{0.4}$Ga$_{0.6}$N/GaN superlattice, which reveals clearly defined satellite peaks.
FIG. 4(b) illustrates the PL spectra of the superlattice characterized in FIG. 4(a).

FIG. 4(a) shows a 2θ-ω x-ray diffraction scan of the 10-period $Al_{0.4}Ga_{0.6}N/GaN$ superlattice, which reveals clearly defined satellite peaks, while FIG. 4(b) illustrates the PL spectra of the superlattice characterized in FIG. 4(a). The absence of polarization-induced fields was evidenced by the 3.45 eV (~360 nm) band edge emission of the superlattice. The band edge emission did not experience the subtle red-shift present in c-plane superlattices.

REFERENCES

The following references are incorporated by reference herein:

1. T. Takeuchi, S. Sota, M. Katsuragawa, M. Komori, H. Takeuchi, H. Amano, and I. Akasaki, Japanese Journal of Applied Physics, Part 2 (Letters) 36, L382–5 (1997).

2. P. Lefebvre, A. Morel, M. Gallart, T. Taliercio, J. Allegre, B. Gil, H. Mathieu, B. Damilano, N. Grandjean, and J. Massies, Applied Physics Letters 78, 1252–4 (2001).

3. N. Grandjean, B. Damilano, S. Dalmasso, M. Leroux, M. Laugt, and J. Massies, J. Appl. Phys. 86 (1999) 3714.

4. M. Leroux, N. Grandjean, J. Massies, B. Gil, P. Lefebvre, and P. Bigenwald, Phys. Rev. B 60 (1999) 1496.

5. R. Langer, J. Simon, V. Ortiz, N. T. Pelekanos, A. Barski, R. Andre, and M. Godlewski, Appl. Phys. Lett. 74 (1999) 3827.

6. P. Lefebvre, J. Allegre, B. Gil, H. Mathieu, N. Grandjean, M. Leroux, J. Massies, and P. Bigenwald, Phys. Rev. B 59 (1999) 15363.

7. I. Jin Seo, H. Kollmer, J. Off, A. Sohmer, F. Scholz, and A. Hangleiter, Phys. Rev. B 57 (1998) R9435.

8. P. Seoung-Hwan and C. Shun-Lien, Appl. Phys. Lett. 76 (2000) 1981.

9. P. Waltereit, O. Brandt, A. Trampert, H. T. Grahn, J. Menniger, M. Ramsteiner, M. Reiche, and K. H. Ploog, Nature 406 (2000) 865.

10. H. M. Ng, Appl. Phys. Lett. 80 (2002) 4369.

11. M. D. Craven, S. H. Lim, F. Wu, J. S. Speck, and S. P. DenBaars, Appl. Phys. Lett. 81 (2002) 469.

12. O. Brandt, P. Waltereit, and K. H. Ploog, J. Phys. D, Appl. Phys. (UK) 35 (2002) 577.

13. M. Leszczynski, H. Teisseyre, T. Suski, I. Grzegory, M. Bockowski, J. Jun, S. Porowski, K. Pakula, J. M. Baranowski, C. T. Foxon, and T. S. Cheng, Appl. Phys. Lett. 69 (1996) 73.

14. A. F. Wright, J. Appl. Phys. 82 (1997) 2833.

15. I. H. Tan, G. L. Snider, L. D. Chang, and E. L. Hu, J. Appl. Phys. 68 (1990) 4071.

16. E. Yablonovitch and E. O. Kane, Journal of Lightwave Technology LT-4(5), 504–6 (1986).

Conclusion

This concludes the description of the preferred embodiment of the present invention. The following describes some alternative embodiments for accomplishing the present invention.

For example, variations in non-polar (Al,In,Ga)N quantum wells and heterostructures design and MOCVD growth conditions may be used in alternative embodiments. Moreover, the specific thickness and composition of the layers, in addition to the number of quantum wells grown, are variables inherent to quantum well structure design and may be used in alternative embodiments of the present invention.

Further, the specific MOCVD growth conditions determine the dimensions and compositions of the quantum well structure layers. In this regard, MOCVD growth conditions are reactor dependent and may vary between specific reactor designs. Many variations of this process are possible with the variety of reactor designs currently being using in industry and academia.

Variations in conditions such as growth temperature, growth pressure, V/III ratio, precursor flows, and source materials are possible without departing from the scope of the present invention. Control of interface quality is another important aspect of the process and is directly related to the flow switching capabilities of particular reactor designs. Continued optimization of the growth conditions will result in more accurate compositional and thickness control of the integrated quantum well layers described above.

In addition, a number of different growth methods other than MOCVD could be used in the present invention. For example, the growth method could also be molecular beam epitaxy (MBE), liquid phase epitaxy (LPE), hydride vapor phase epitaxy (HVPE), sublimation, or plasma-enhanced chemical vapor deposition (PECVD).

Further, although non-polar a-plan GaN thin films are described herein, the same techniques are applicable to non-polar m-plane GaN thin films. Moreover, non-polar InN, AlN, and AlInGaN thin films could be created instead of GaN thin films.

Finally, substrates other than sapphire substrate could be employed for non-polar GaN growth. These substrates include silicon carbide, gallium nitride, silicon, zinc oxide, boron nitride, lithium aluminate, lithium niobate, germanium, aluminum nitride, and lithium gallate.

In summary, the present invention describes a method for forming non-polar (Al,B,In,Ga)N quantum well and heterostructure materials and devices. First, non-polar ($11\bar{2}0$) a-plane GaN thin film layers are grown on a ($1\bar{1}02$) r-plane sapphire substrate using MOCVD. These non-polar ($11\bar{2}0$) a-plane GaN layers comprise templates for producing non-polar (Al,B,In,Ga)N quantum well and heterostructure materials and devices.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for forming a nitride semiconductor device, comprising:
   (a) annealing a substrate;
   (b) depositing a nitride-based nucleation layer on the substrate;
   (c) growing one or more non-polar a-plane gallium nitride (GaN) layers on the nucleation layer;
   (d) cooling the non-polar a-plane GaN layers under a nitrogen overpressure; and
   (e) growing one or more non-polar (Al,B,In,Ga)N layers on the non-polar a-plane GaN layers.

2. The method of claim 1, wherein the substrate is an r-plane sapphire substrate.

3. The method of claim 1, wherein the substrate is selected from a group comprising silicon carbide, gallium nitride, silicon, zinc oxide, boron nitride, lithium aluminate, lithium niobate, germanium, aluminum nitride, and lithium gallate.

4. The method of claim 1, wherein the grown non-polar (Al,B,In,Ga)N layers comprise at least one quantum well.

5. The method of claim 4, wherein the quantum well comprises an InGaN quantum well.

6. The method of claim 4, wherein the quantum well is capped with GaN.

7. The method of claim 1, wherein the grown non-polar (Al,B,In,Ga)N layers comprise at least one heterostructure.

8. The method of claim 7, wherein the heterostructure contains an (Al,Ga)N/GaN superlattice.

9. The method of claim 1, wherein the growing steps are performed by a method selected from a group comprising metalorganic chemical vapor deposition (MOCVD), molecular beam epitaxy (MBE), liquid phase epitaxy (LPE), hydride vapor phase epitaxy (HVPE), sublimation, and plasma-enhanced chemical vapor deposition (PECVD).

* * * * *